United States Patent [19]
Laurx

[11] Patent Number: 6,112,911
[45] Date of Patent: Sep. 5, 2000

[54] SUPPORT ASSEMBLY FOR BOARD-MOUNTED ELECTRICAL APPLIANCE

[75] Inventor: John C. Laurx, Aurora, Ill.

[73] Assignee: Molex Incorporated, Lisle, Ill.

[21] Appl. No.: 09/021,613

[22] Filed: Feb. 10, 1998

[51] Int. Cl.⁷ .............................. A47G 19/08; A47F 7/00
[52] U.S. Cl. .......................................... 211/41.17; 211/26
[58] Field of Search .................................. 211/41.17, 26; 411/45, 46, 47, 48, 349, 553; 361/740, 754, 759, 739, 785; 29/739

[56] References Cited

U.S. PATENT DOCUMENTS

| | | | |
|---|---|---|---|
| 4,202,593 | 5/1980 | Abernethy et al. | 339/125 |
| 4,869,680 | 9/1989 | Yamamoto et al. | 211/41.17 X |
| 4,884,336 | 12/1989 | Waters et al. | 29/845 |
| 4,889,502 | 12/1989 | Althouse et al. | 439/607 |
| 5,108,308 | 4/1992 | Northcraft et al. | 439/555 |
| 5,199,836 | 4/1993 | Gogarty | 411/553 |
| 5,223,674 | 6/1993 | Reznikov | 174/138 |
| 5,230,639 | 7/1993 | Schuppert, Jr. | 439/572 |
| 5,241,451 | 8/1993 | Walburn et al. | 361/785 |
| 5,254,016 | 10/1993 | Ganthier | 439/567 |
| 5,266,052 | 11/1993 | Phillips, II | 439/562 |
| 5,829,601 | 11/1998 | Yurchenco et al. | 211/41.17 |

FOREIGN PATENT DOCUMENTS

| | | |
|---|---|---|
| 452641B1 | 2/1991 | European Pat. Off. . |
| 250097B1 | 3/1993 | European Pat. Off. . |
| 593336A1 | 10/1993 | European Pat. Off. . |
| 8-64276 | 8/1996 | Japan . |
| 95/13636 | 5/1995 | WIPO . |

*Primary Examiner*—Daniel P. Stodola
*Assistant Examiner*—Erica B. Harris
*Attorney, Agent, or Firm*—Robert J. Zeitler

[57] ABSTRACT

A support assembly for mounting an electrical appliance on a printed circuit board. The assembly includes a supporting structure for mounting on top of the printed circuit board and one or more securing members for securing the supporting structure to the printed circuit board. The supporting structure includes expandable pegs adapted for insertion into printed circuit board mounting holes. The securing members are push pins configured to be inserted into the pegs to expand the pegs within the mounting holes so as to provide an interference fit between the pegs and the printed circuit board thereby securing the assembly thereto.

28 Claims, 5 Drawing Sheets

SUPPORT ASSEMBLY FOR BOARD-MOUNTED ELECTRICAL APPLIANCE

FIELD OF THE INVENTION

This invention generally relates to the art of electrical connector or appliance mounting devices and, particularly, to a support assembly for mounting an electrical appliance on a printed circuit board.

BACKGROUND OF THE INVENTION

A wide variety of hardware, framework, support structures, apparatus and the like are used to mount electrical connectors, electronic components and other electrical appliances on printed circuit boards or substrates. For instance, various structures are used to mount rather large microprocessor modules or cartridges on the top surface of a printed circuit board (motherboard) of computers such as personal computers.

An inherent problem in mounting microprocessor modules on printed circuit boards in computers or the like is that the modules are relatively large and heavy in comparison to other smaller electronic components, connectors and the like which are mounted on the board. Consequently, the support assembly for mounting the module on the board is large, unduly expensive and comprises multiple components.

For instance, a known support assembly includes a supporting structure disposed on top of the printed circuit board and a securing structure on the bottom of the board, with the structures being interconnected through the board. The bottom securing structure is a multi-component subassembly which includes at least a body portion usually fabricated of plastic material and a plurality of separate metal, externally threaded studs which project through holes in the board from the bottom to the top surface thereof. The supporting structure for the microprocessor module on top of the board also is a multi-component subassembly which includes an elongated support bracket with separate nuts for threadingly engaging the threaded studs extending through the board from the bottom securing structure. Still further components, such as separate metal clips, are used to hold the nuts on the bracket of the top supporting structure. Additionally, assembly of the securing structure on the bottom of the board requires the assembler to access the underside of the printed circuit board. Accessing the underside of the circuit board can increase the likelihood of mishandling and damage which in turn increases quality problems and associated costs.

All of these separate components of the supporting and securing structures of the support assembly and the fact that the assembler must access the underside of the printed circuit board add significantly to the manufacturing and assembly costs of the overall support arrangement. The present invention is directed to solving these problems by providing a much simpler and less expensive support assembly of the character described, particularly involving considerably fewer components than the prior art described above and capable of assembly without accessing the underside of the printed circuit board.

SUMMARY OF THE INVENTION

An object, therefore, of the invention is to provide a new and improved support assembly or apparatus for mounting an electrical appliance on a printed circuit board or substrate.

In the exemplary embodiment of the invention, the support assembly includes a supporting structure or upper frame having resilient portions or flexible members configured to be inserted into apertures in the printed circuit board and securing members or pins configured to be inserted into the resilient portions or flexible members. The supporting structure or upper frame is mounted on top of the printed circuit board. The securing members or pins are inserted from above into the supporting structure engaging the resilient portions or flexible members therein. The resilient portions thereby expand to engage the printed circuit board securing the support assembly thereto.

The invention contemplates that the supporting structure be a one-piece component having flexible members or resilient portions configured as pegs which can be inserted into apertures in the printed circuit board. The supporting structure also includes a means for mounting the electrical appliance on top of the printed circuit board. The securing members or pins can be inserted into the resilient portions of the supporting structure thereby causing the resilient portions to engage the printed circuit board and secure the supporting structure thereto.

As disclosed herein, the one-piece supporting structure is unitarily molded of plastic material and includes resiliently expandable locator pegs projecting from the underside of the supporting structure for insertion into apertures in the printed circuit board. The locator pegs position the supporting structure on the printed circuit board before the pins or securing members are inserted into the supporting structure. Each peg contains a bore or cavity therein extending from the top side of the supporting structure into the peg and adapted to receive the pin or securing member therein. When the pin is fully inserted into the bore the locator peg expands within the aperture thereby securing the support assembly to the printed circuit board.

In the preferred embodiment, the top supporting structure is elongated to define opposite ends. Two resiliently expandable locator pegs are provided on each opposite end of the elongated supporting structure. Retention bases on the supporting structure are located above each peg configured to retain the respective pins therein once the pins are fully inserted into their respective bores.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENT

Figure 1:
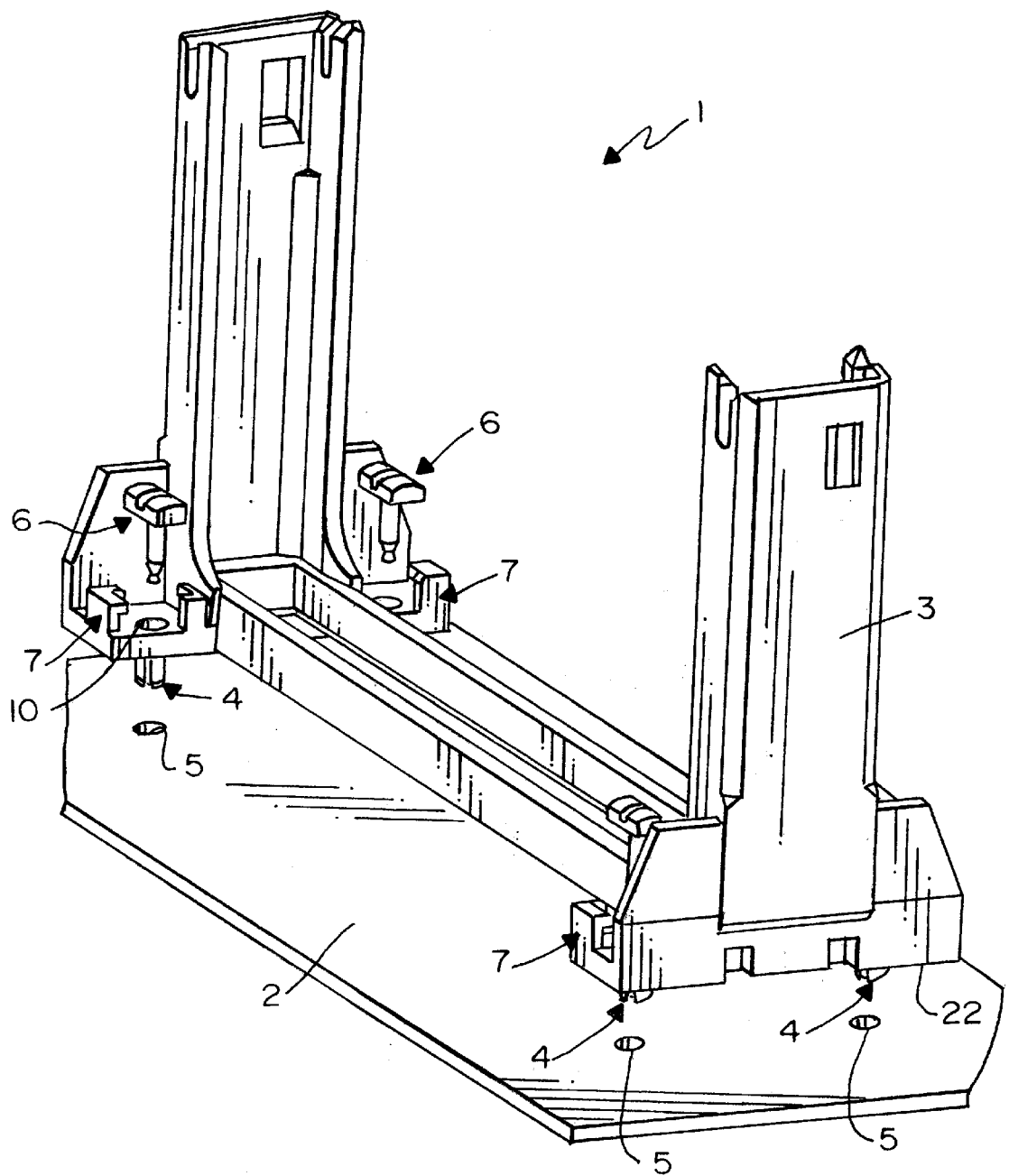
FIG. 1 is an exploded perspective view of the support assembly of the invention in conjunction with a printed circuit board on which the assembly is secured.

Referring to the drawings in greater detail, and first to FIG. 1, the invention is embodied in a support assembly, generally designated 1, for mounting an electrical appliance on a printed circuit board 2. Specifically, the support assembly is adapted for supporting and mounting a thin box-like microprocessor module or cartridge (not shown) on the printed circuit board. Generally, support assembly 1 includes an elongated top supporting structure 3 disposed on top of the printed circuit board including resiliently expandable locator pegs, generally designated 4, projecting from an underside 22 of the supporting structure and configured for insertion into mounting holes 5 in the printed circuit board. The supporting structure is adapted to receive four push pins, generally designated 6, inserted from above the supporting structure into the resiliently expandable locator pegs. The supporting structure has two pairs of resiliently expandable pegs located at opposite ends of the supporting structure. The pegs are configured for insertion into four mounting holes 5 in the printed circuit board. The supporting structure 3 and the push pins 6 interengage to secure the support assembly to the printed circuit board, as described in greater detail hereinafter.

Specifically, the supporting structure 3 further contains four retention bases 7 located above each resiliently expandable peg 4 and configured to accept individual push pins 6 and retain each therein. The expandable peg is adapted to accept the push pin and thereby expand to provide an interference fit with printed circuit board 2 securing the support assembly to the printed circuit board.

Figure 2:
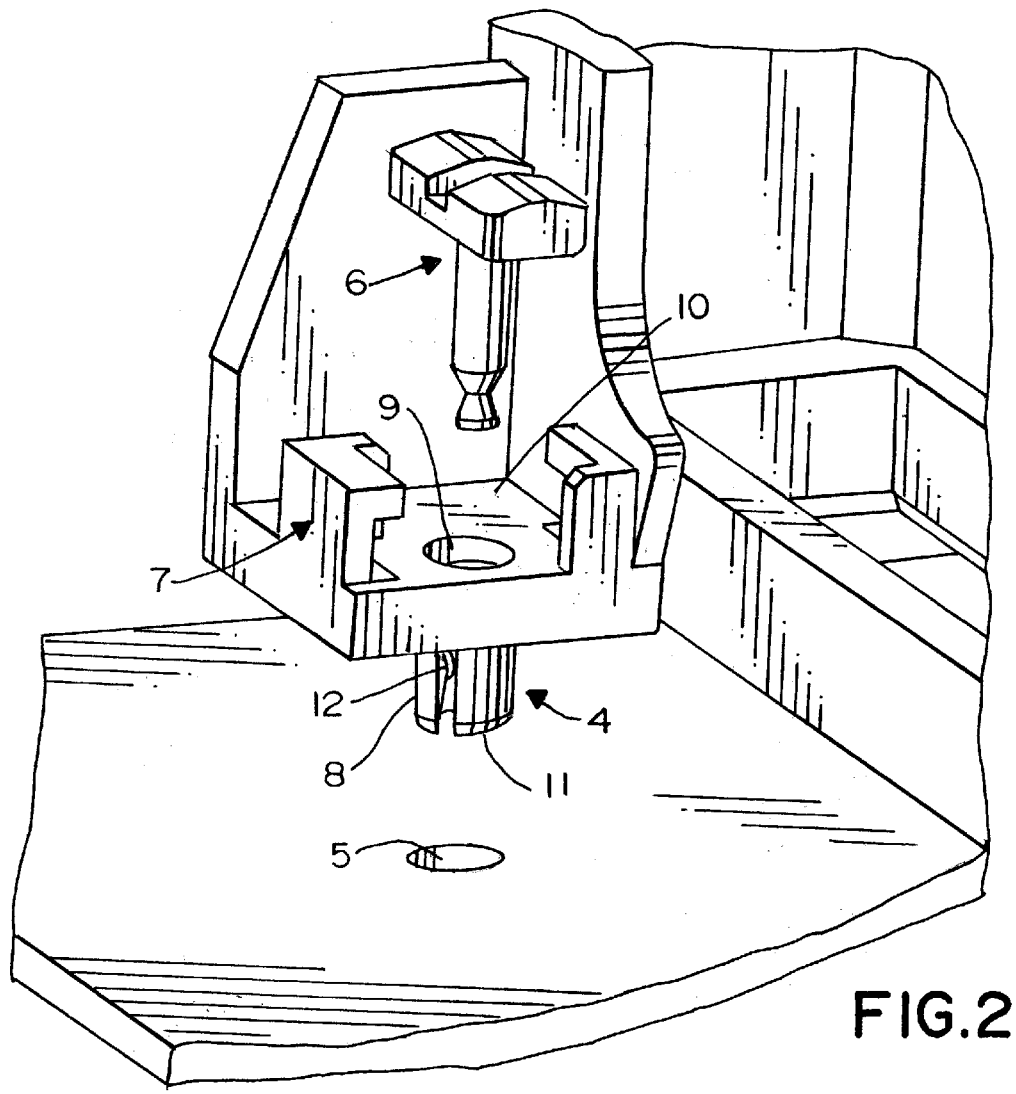
FIG. 2 is an enlarged fragmented perspective view of one end of the support assembly.

More particularly, referring to FIG. 2 in conjunction with FIG. 1, each expandable peg 4 comprises resilient side walls 8 which define a cavity or bore 9 into which a push pin 6 can be inserted. The bore may extend from a top surface 10 of the supporting structure to a distal end 11 of the expandable peg and is configured to accept a push pin therein. Each side wall contains a protrusion 12 which extends out of the sidewall into the bore such that when the pin is fully inserted into the bore, the push pin engages the protrusion and the resilient side wall is pushed outward thereby expanding the peg.

Figure 3:
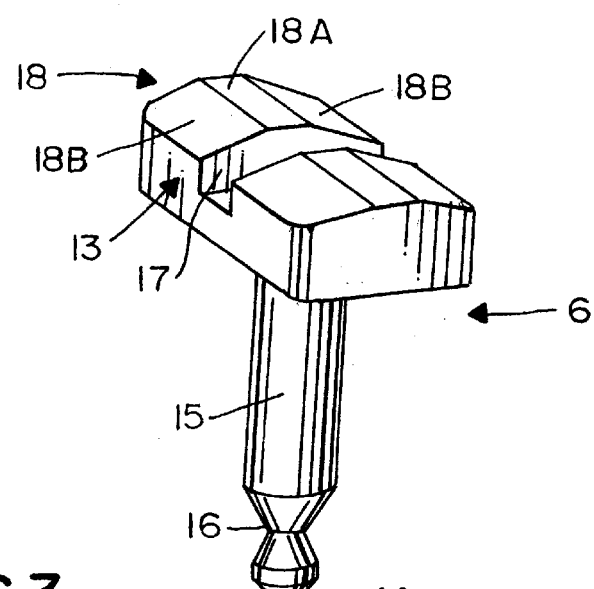
FIG. 3 is a perspective of one of the pins of the assembly.

Shown in detail in FIG. 3, each push pin 6 comprises a head portion 13, a tip 14 and an elongated portion 15 located therebetween. The elongated portion contains a reduced portion 16 adjacent the tip. The head portion contains a slot 17 therein and head surface, generally designated 18, defined by a flat surface 18A and two ramped surfaces 18B adjacent to and on opposite sides of the flat surface 18A. The reduced portion is configured (see FIG. 2) to engage the protruding portion 12 of each resilient side wall which extends into the bore 9 when the pin is partially inserted into the bore. This arrangement allows for the pins to be partially inserted in the supporting assembly 1 and retained therein without expanding the pegs 4. The support assembly can then be provided as a single unit, ready for insertion into the printed circuit board. Consequently, the worker on the assembly line does not have to engage in the tedious task of inserting each individual pin into each bore.

Figure 4:
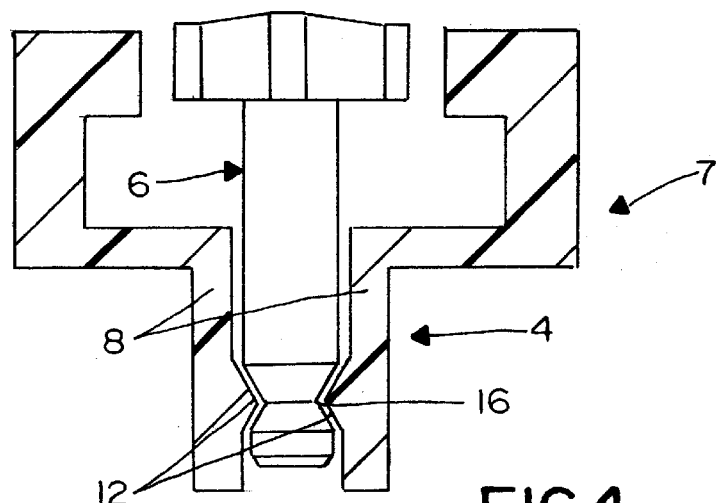
FIG. 4 is a cross-sectional view of the push pin, the retention base and bore with the push pin partially inserted into the bore.

Before the assembly 1 is secured to the printed circuit board, the protruding portions 12 of the sidewalls engage the reduced portion 16 of the pin when the pin is partially inserted into the bore as shown in FIG. 4. As stated previously, the interengagement of the protruding portion with the reduced portion allows for each individual pin to be retained within its respective bore without expanding the peg 4. The pegs, with the pins partially inserted, are then inserted into mounting holes 5 in the printed circuit board 2. To secure the support assembly to the printed circuit board the pins are fully inserted into the bore. Upon full insertion, the elongated portion 15 of the pin engages the protruding portions 12 deflecting the sidewalls 8 outward and thereby expanding the peg. The expansion of the peg while in the locator hole causes an interference fit between the peg and the printed circuit board thereby securing the assembly to the board.

Figure 5:
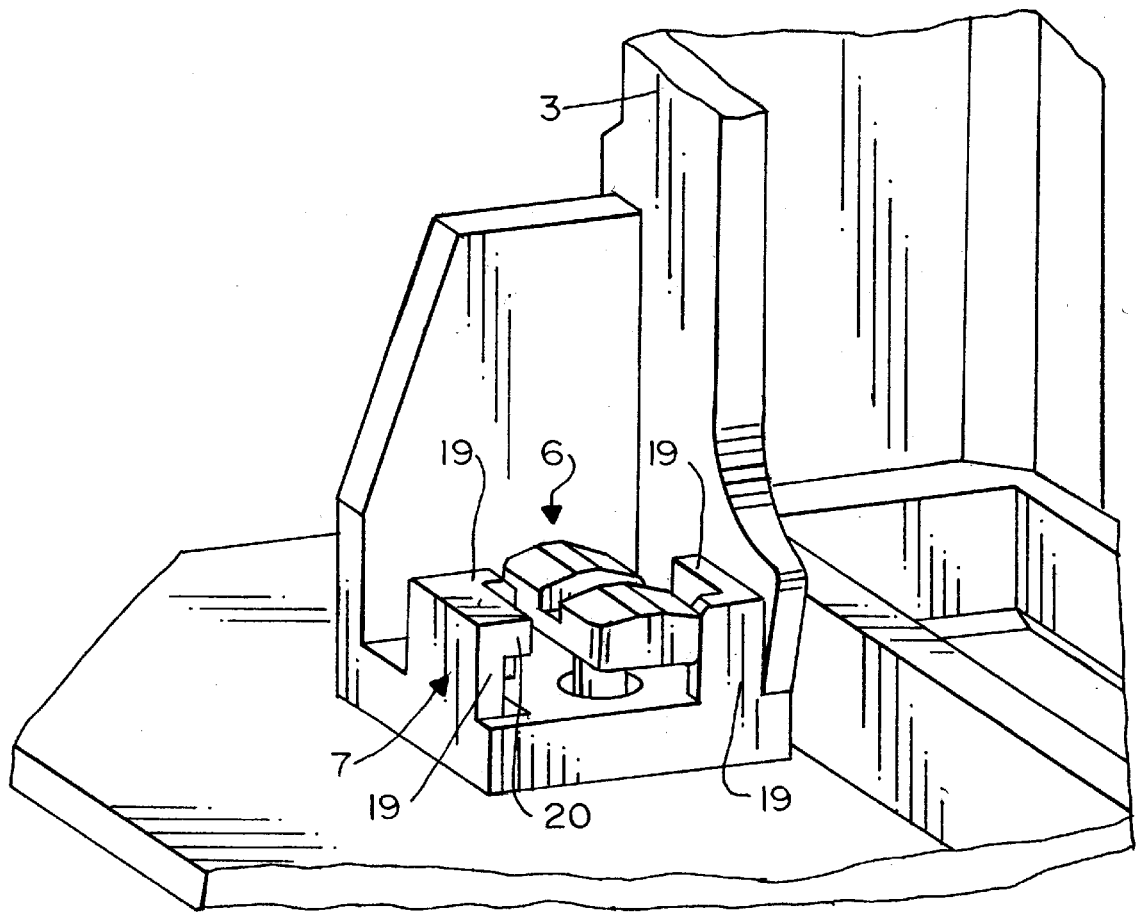
FIG. 5 is a fragmented, enlarged perspective view of one end of the support assembly, illustrating the retention base, the expandable peg and a pin partially inserted therein.

Referring to FIG. 3 again, each head portion slot 17 is adapted to engage a tool such as a standard screw driver to facilitate insertion and rotation of the pin in the bore. FIG. 5 shows the retention base 7 which is adapted to accept the head portion as the pin is inserted into and rotated within the bore. Specifically, the retention base includes two "L" shaped vertical retention walls 19, each having a ledge 20 which projects perpendicularly from the top of the retention wall toward the bore. The retention walls are located opposite each other in a spaced-apart relationship such that the head portion can be accepted between the retention walls when the pin is fully inserted into the bore.

Figure 6:
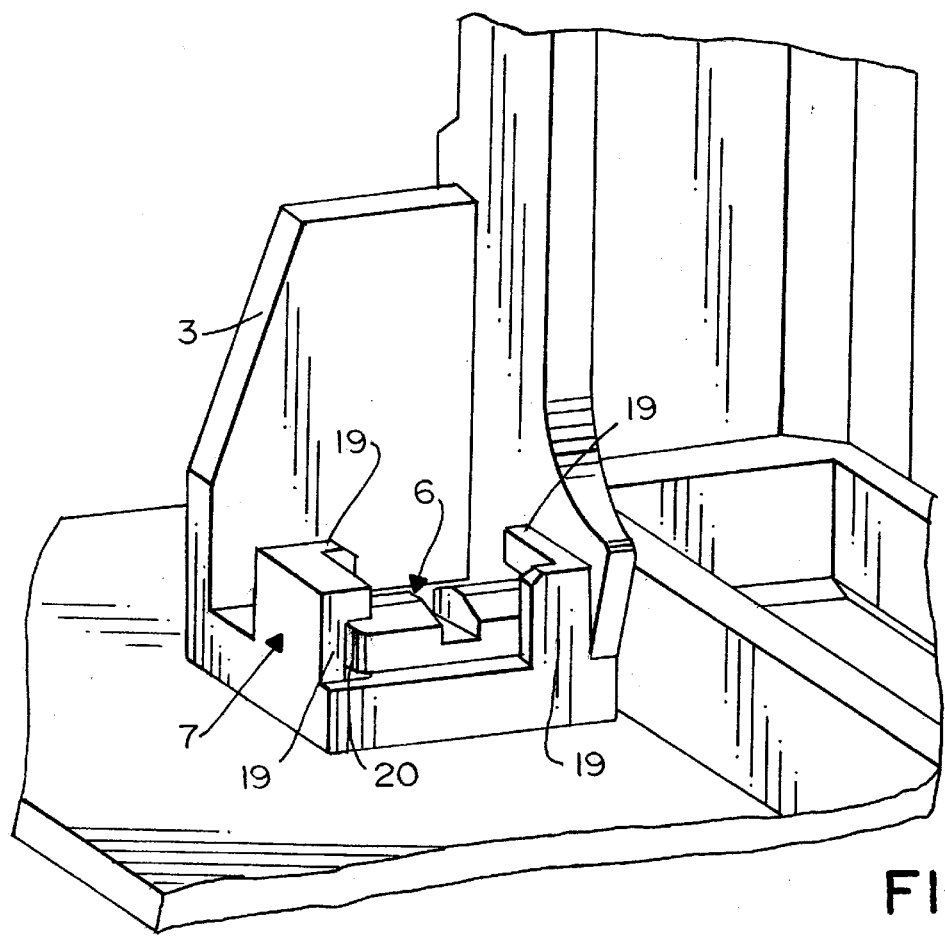
FIG. 6 is an enlarged fragmented perspective view of one end of the support assembly mounted on the printed circuit board, illustrating the retention base with a pin fully inserted and secured in the retention base.

To secure the pin 6 within the retention base 7, the pin is rotated 90 degrees clockwise. FIG. 6 shows a retention base with the pin in the secured position. The head portion 13 is secured between the two retention walls 19 and the ledge 20 prevents the pin from being pushed upward once the pin is rotated into the secured position. To disengage the pin head portion from the retention base ledges, the pin head portion must be rotated 90 degrees counter-clockwise.

Figure 7:
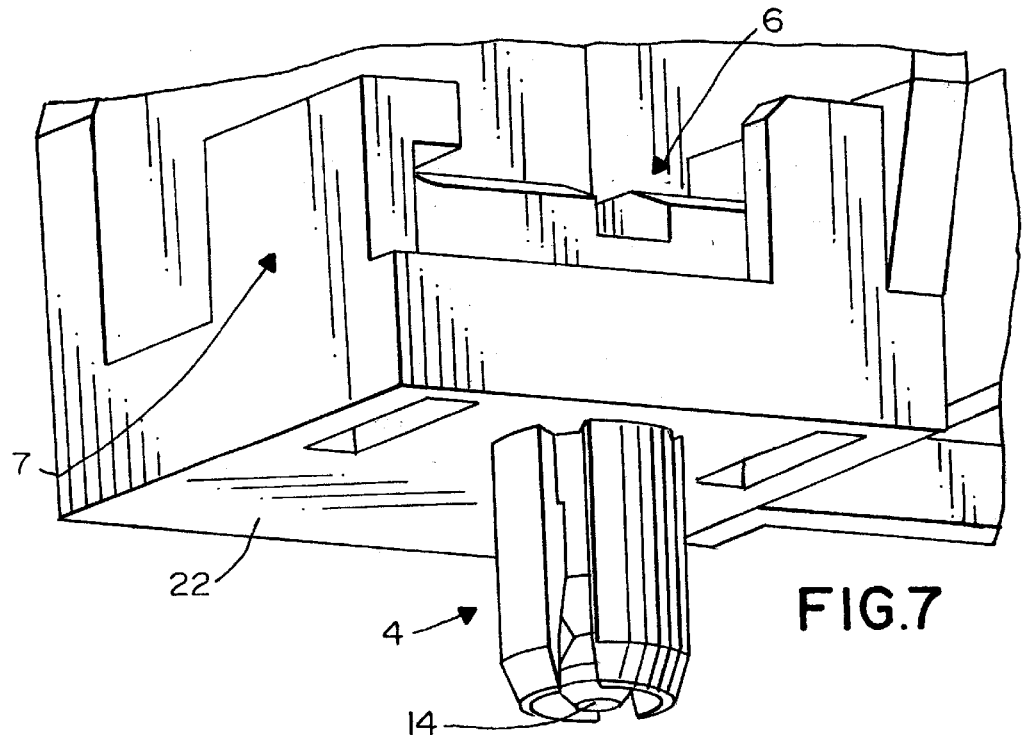
FIG. 7 is a bottom perspective view of a resiliently expandable locator peg of the supporting structure.
Figure 8:
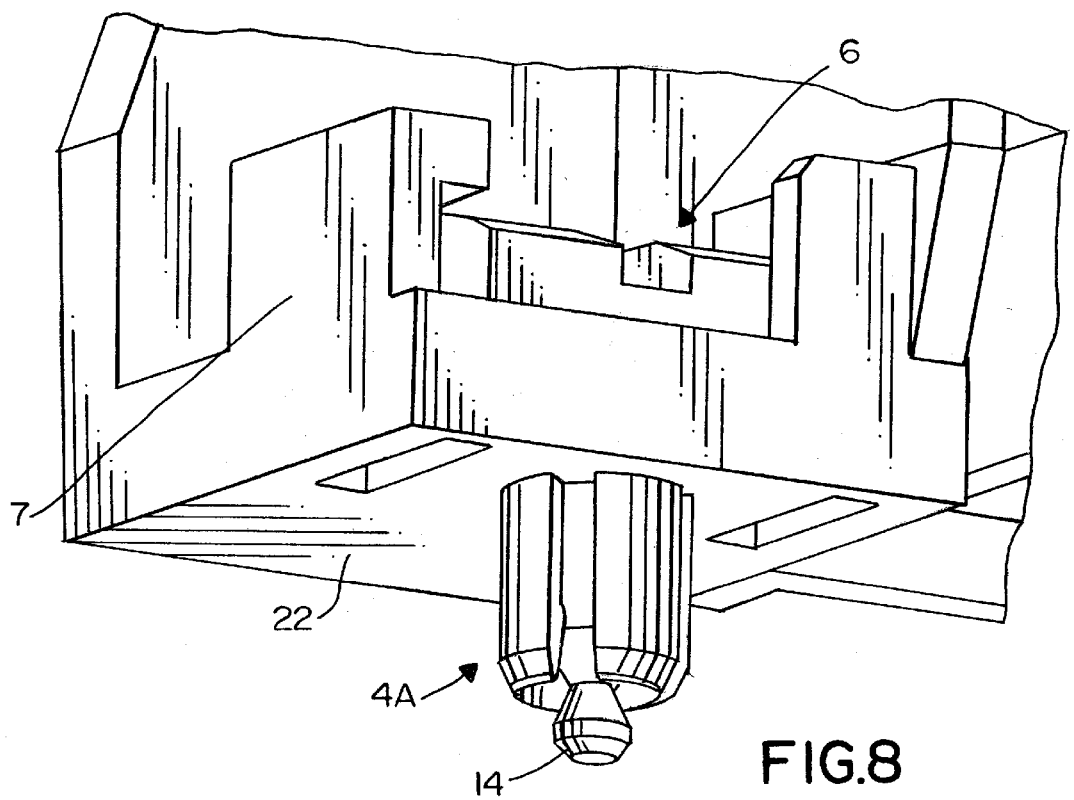
FIG. 8 is a bottom perspective of an alternate embodiment of a resiliently expandable locator peg of the supporting structure.

FIG. 7 and 8 illustrate two alternate embodiments of expandable pegs. FIG. 7 shows an expandable peg 4 which projects from the underside of the supporting structure 3 a distance greater than the distance the push pin 6 projects when it is fully inserted into the bore 9. This arrangement protects the pin from being pushed out from the underside when the printed circuit board 2 is placed on a flat surface. FIG. 8 shows a shorter expandable peg 4A which projects from the underside of the supporting structure a distance less than the distance the push pin projects when it is fully inserted into the bore. The tip 14 of the pin which extends beyond the shorter peg 4A can be broken off later in a secondary operation if necessary. The shorter peg may be advantageous if there are space constraints under the board.

Figure 9:
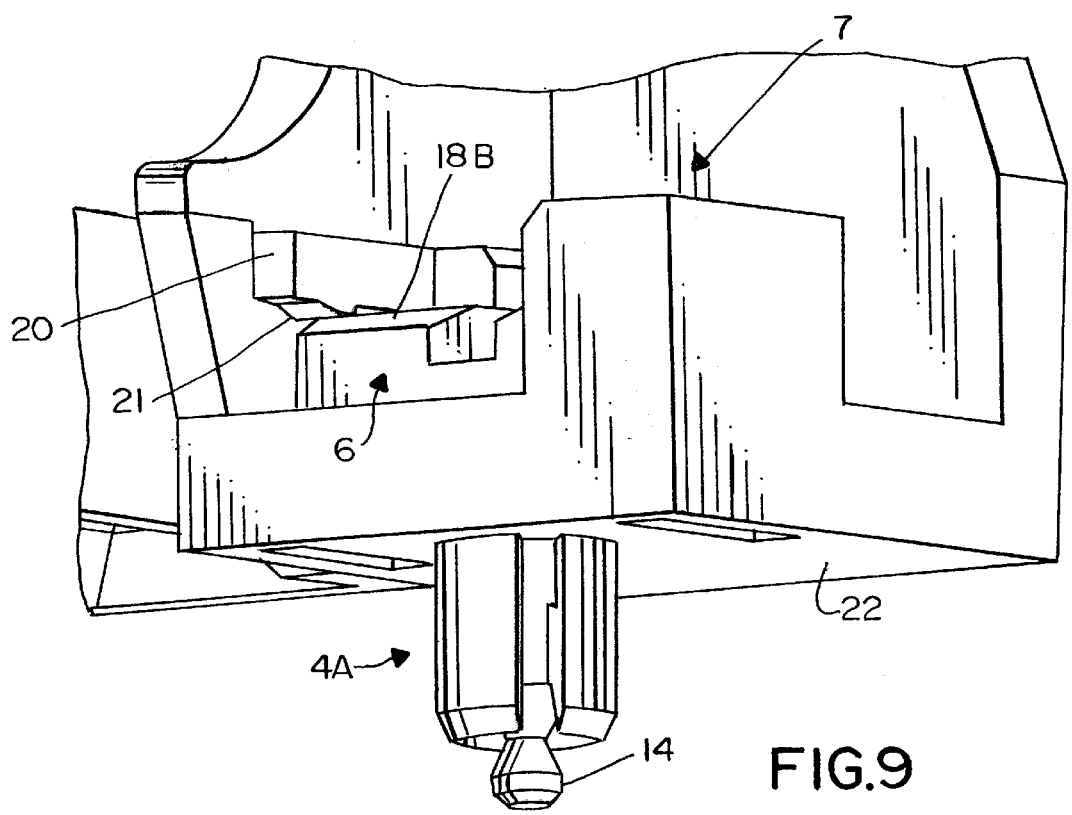
FIG. 9 is a bottom perspective view of one end of the support assembly, illustrating the retention base with retention bump therein.

Support assemblies are frequently exposed to high vibration or high impact testing. It may be advantageous to have a secondary retention means to further ensure the pin 6 is secured in the retention base 7. FIG. 9 illustrates a retention base with a secondary retention means. The ledge 20 and a retention bump 21 located on the underside of the ledge 20 are configured to interengage the head surface 18 of the pin when it is rotated within the retention base. More particularly, referring back to FIG. 3 in conjunction with FIG. 9, one of the ramped surfaces 18B first engages the retention bump as the head portion 13 is rotated under the ledges 20. As the head portion is further rotated the flat surface 18A engages the retention bump. Finally the other ramped surface 18B slides under the retention bump until the head portion is rotated the full 90 degrees within the retention base. The retention bump engages the ramped surface in a manner which provides a secondary retainment means to secure the pin within the bore.

It should be understood that such terms as "top", "bottom", "upwardly", "horizontally", "vertically", and the like herein and in the claims hereof have been used to provide a clear and concise understanding of the invention, only. Such terms are not in any way to be construed as limiting, because the support assembly obviously is omni-directional in use.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

What is claimed is:

1. A support system for mounting an electrical appliance on a printed circuit board having at least one mounting aperture therethrough, comprising:
    a supporting structure having a top surface and underside for mounting on top of the printed circuit board,
    at least one resiliently expandable peg projecting from the underside of the supporting structure and adapted for insertion into the mounting aperature,
    a bore extending from the top surface into the expandable peg;
    a removably insertable pin, said pin insertable into the bore and adapted to expand the peg into securing engagement in the mounting aperture in the printed circuit board when said pin is inserted into the bore; and
    a retention base on the support structure proximate the peg adapted to retain the pin to the structure when the peg is in securing engagement in the mounting aperture.

2. The support system of claim 1 wherein said retention base includes two vertical retention walls.

3. The support system of claim 2 wherein said retention walls each contain a top end and a ledge projecting generally perpendicular from the top of each said retention wall toward said bore.

4. The support system of claim 2 wherein said retention walls are located generally opposite each other.

5. The support assembly of claim 2 wherein the bore extends from the top surface of the support structure proximate the retention base to a distal end of the peg.

6. The support assembly of claim 5 wherein the pin includes an elongated portion having a reduced portion, a head portion located at one end of the elongated portion and a tip at an opposite end of the elongated portion.

7. The support assembly of claim 6 wherein when the pin is fully inserted into the bore, the tip of the pin extends a greater distance from the underside of the structure than the distal end of the peg extends from the underside of the structure.

8. The support assembly of claim 6 wherein the peg is defined by a plurality of side walls, each side wall including a protruding portion which extends into the bore, the reduced portion of the pin and the protruding portion of the side wall configured to interengage and retain the pin within the bore when the pin is partially inserted into the bore.

9. The support assembly of claim 8 wherein when the pin is fully inserted into the bore, the elongated portion of the pin engages the protruding portion of the side wall thereby deflecting the sidewall into engagement with the printed circuit board to secure the assembly to the printed circuit board.

10. The support assembly of claim 9 wherein when the pin is fully inserted into the bore, the distal end of the peg extends a greater distance from the underside of the structure than the tip of the pin extends from the underside of the structure.

11. The support assembly of claim 2 wherein the support structure is configured to accept insertion of the pin from above the printed circuit board.

12. The support assembly of claim 11 wherein the pin contains a head portion adapted to facilitate the insertion of the pin into the bore and securement of the pin within the retention base.

13. The support assembly of claim 12 wherein the head portion contains a slot adapted to facilitate the rotation of the pin with a tool within the retention base.

14. The support system of claim 13 wherein said pin is rotated 90 degrees to secure the pin to the retention base.

15. The support system of claim 14 wherein said secured pin is rotated 90 degrees to disengage the pin from the retention base.

16. An apparatus for supporting a microprocessor on a substrate having a mounting hole therein, comprising:
    an upper frame having a receiving face, a substrate mounting face, a displaceable flexible member projecting from the substrate mounting face and adapted for insertion into the mounting hole and a cavity extending from the receiving face into the flexible member;
    a removable insertable securing member, said securing member adapted to be inserted into the cavity and thereby displace the flexible member into securing engagement with the substrate when said securing member is inserted into the cavity; and
    a retention member on the upper frame proximate the cavity and adapted to retain the securing member to the frame.

17. The apparatus of claim 16 wherein said retention member includes two vertical retention walls, said retention walls being located generally opposite each other, and said retention walls further including a top end and a ledge projecting generally perpendicular from the top of said retention walls toward said cavity.

18. The apparatus of claim 17 wherein the upper frame is configured to accept insertion of the securing member from above the substrate.

19. The apparatus of claim 18 wherein the securing member contains a head portion adapted to facilitate the insertion of the securing member into the cavity and securement of the securing member within the retention member.

20. The apparatus of claim 19 wherein the head portion contains a slot adapted to facilitate the rotation of the securing member with a tool within the retention member.

21. The apparatus of claim 20 wherein said securing member is rotated 90 degrees to engage the securing member to the retention base.

22. The apparatus of claim 21 wherein said engaged securing member is rotated 90 degrees to disengage the securing member from the retention member.

23. The apparatus of claim 17 wherein the cavity is located proximate the retention member and extends from the receiving face of the upper frame to a distal end of the flexible member.

24. The apparatus of claim 23 wherein the securing member includes an elongated portion having a reduced portion, a head portion located at one end of the elongated portion and a tip at an opposite end of the elongated portion.

25. The apparatus of claim 24 wherein when the securing member is fully inserted into the cavity, the tip of the securing member extends a greater distance from the substrate mounting face than the distal end of the flexible member extends from the substrate mounting face.

26. The apparatus of claim 24 wherein the flexible member is defined by a plurality of side walls, each side wall including a protruding portion which extends into the cavity, the reduced portion of the securing member and the protruding portion of the side wall configured to interengage and retain the securing member within the cavity when the securing member is partially inserted into the cavity.

27. The apparatus of claim 26 wherein when the securing member is fully inserted into the cavity, the elongated portion of the securing member engages the protruding portion of the side wall thereby deflecting the sidewall into engagement with the substrate to secure the apparatus to the substrate.

28. The apparatus of claim 27 wherein when the securing member is fully inserted into the cavity, the distal end of the flexible member extends a greater distance from the substrate mounting face of the upper frame than the tip of the securing member extends from the substrate mounting face.

* * * * *